(12) United States Patent
Mizushima et al.

(10) Patent No.: US 10,367,467 B2
(45) Date of Patent: Jul. 30, 2019

(54) COMPOSITE ELECTRONIC COMPONENT

(71) Applicant: Murata Manufacturing Co., Ltd., Kyoto-fu (JP)

(72) Inventors: Takanao Mizushima, Nagaokakyo (JP); Kazuhide Kudo, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 8 days.

(21) Appl. No.: 15/786,988

(22) Filed: Oct. 18, 2017

(65) Prior Publication Data
US 2018/0123545 A1 May 3, 2018

(51) Int. Cl.
| | |
|---|---|
| H03H 7/01 | (2006.01) |
| H01F 27/28 | (2006.01) |
| H01G 4/40 | (2006.01) |
| H01G 5/04 | (2006.01) |
| H01F 17/04 | (2006.01) |
| H01F 27/29 | (2006.01) |

(Continued)

(52) U.S. Cl.
CPC ............ H03H 7/0115 (2013.01); H01F 17/04 (2013.01); H01F 27/2804 (2013.01); H01F 27/29 (2013.01); H01F 27/40 (2013.01); H01G 4/224 (2013.01); H01G 4/232 (2013.01); H01G 4/30 (2013.01); H01G 4/40 (2013.01); H01G 5/04 (2013.01); H01F 2027/2809 (2013.01); H03H 2001/005 (2013.01); H03H 2001/0042 (2013.01); H03H 2001/0085 (2013.01)

(58) Field of Classification Search
CPC ..................... H03H 7/0115; H03H 2001/0085
USPC .................................................. 333/175, 185
See application file for complete search history.

(56) References Cited

U.S. PATENT DOCUMENTS

| | | | |
|---|---|---|---|
| 2006/0014303 A1* | 1/2006 | Takazawa | ........... H01F 17/0013 438/1 |
| 2015/0109074 A1* | 4/2015 | Son | ...................... H03H 7/0115 333/185 |
| 2018/0226935 A1* | 8/2018 | Yazaki | ..................... H01G 4/40 |

FOREIGN PATENT DOCUMENTS

| | | |
|---|---|---|
| CN | 104578753 A | 4/2015 |
| JP | S61-134115 U | 8/1986 |

(Continued)

OTHER PUBLICATIONS

An Office Action; "Notification of Reasons for Refusal," Mailed by the Japanese Patent Office dated Jan. 22, 2019, which corresponds to Japanese Patent Application No. 2016-213610 and is related to U.S. Appl. No. 15/786,988; with English language translation.

(Continued)

*Primary Examiner* — Rakesh B Patel
(74) *Attorney, Agent, or Firm* — Studebaker & Brackett PC

(57) ABSTRACT

A composite electronic component includes a capacitor component and an inductor component. A capacitor body has a first end face and a second end face that are opposed to each other in a longitudinal direction and a first side face. At least one of capacitor outer electrodes is provided on the first end face of the capacitor body. An inductor body has a first end face and a second end face that are opposed to each other in the longitudinal direction and a first side face. At least one of inductor outer electrodes is provided on the first end face of the inductor body. The first side face of the capacitor body is opposed to the first side face of the inductor body, and the first end face of the capacitor body and the first end face of the inductor body are positioned in the same direction.

10 Claims, 5 Drawing Sheets

(51) Int. Cl.
*H01F 27/40* (2006.01)
*H01G 4/30* (2006.01)
*H01G 4/224* (2006.01)
*H01G 4/232* (2006.01)
*H03H 1/00* (2006.01)

(56) References Cited

FOREIGN PATENT DOCUMENTS

| JP | S62209892 A | 9/1987 |
| JP | H04117808 A | 4/1992 |
| JP | H06244030 A | 9/1994 |
| JP | 2008-130694 A | 6/2008 |
| JP | 2015079932 A | 4/2015 |

OTHER PUBLICATIONS

An Office Action mailed by the Chinese Patent Office dated Jan. 23, 2019, which corresponds to Chinese Patent Application No. 201711020369.9 and is related to U.S. Appl. No. 15/786,988 with English language translation.

\* cited by examiner

COMPOSITE ELECTRONIC COMPONENT

CROSS REFERENCE TO RELATED APPLICATIONS

This application claims benefit of priority to Japanese Patent Application 2016-213610 filed Oct. 31, 2016, the entire content of which is incorporated herein by reference.

TECHNICAL FIELD

The present disclosure relates to a composite electronic component.

BACKGROUND

Japanese Unexamined Patent Application Publication No. 2008-130694 describes a composite electronic component in related art. This composite electronic component includes a substrate, a coil element disposed on one face of the substrate, and a capacitive element disposed on the other face of the substrate. A first plane face along a longitudinal direction of the coil element is disposed on the one face of the substrate and a first plane face along the longitudinal direction of the capacitive element is disposed on the other face of the substrate. In mounting of the composite electronic component on a mounting board, a connection terminal is provided on a second plane face, which is opposite to the first plane face of the capacitive element, to connect the connection terminal on the capacitive element to the mounting board.

Since the large second plane face of the capacitive element is disposed on the mounting board in the composite electronic component in the related art, the mounting area of the composite electronic component is increased and, thus, it is not possible to mount multiple composite electronic components at a high density.

SUMMARY

Accordingly, it is an object of the present disclosure to provide a composite electronic component having a decreased mounting area in mounting on a mounting board.

According to an embodiment of the present disclosure, a composite electronic component includes a capacitor component and an inductor component. The capacitor component includes a capacitor body, a capacitor element provided in the capacitor body, and multiple capacitor outer electrodes that are provided on the capacitor body and that are electrically connected to the capacitor element. The inductor component includes an inductor body, an inductor element provided in the inductor body, and multiple inductor outer electrodes that are provided on the inductor body and that are electrically connected to the inductor element. The capacitor body has a first end face and a second end face that are opposed to each other in a longitudinal direction and a first side face along the longitudinal direction, with which the first end face is connected to the second end face, and at least one of the capacitor outer electrodes is provided on the first end face of the capacitor body. The inductor body has a first end face and a second end face that are opposed to each other in the longitudinal direction and a first side face along the longitudinal direction, with which the first end face is connected to the second end face, and at least one of the inductor outer electrodes is provided on the first end face of the inductor body. The first side face of the capacitor body is opposed to the first side face of the inductor body, and the first end face of the capacitor body and the first end face of the inductor body are positioned in the same direction.

With the above composite electronic component, the capacitor component is capable of being integrated with the inductor component so that the large first side face of the capacitor body is opposed to the large first side face of the inductor body and so that the small first end face of the capacitor body and the small first end face of the inductor body are positioned in the same direction. In mounting of the capacitor component and the inductor component, which are integrated with each other, on a mounting board, the first end faces are used as mounting faces because the outer electrodes are provided on the first end faces of the capacitor body and the inductor body. Using the small first end faces of the capacitor body and the inductor body as the mounting faces enables the mounting area of the composite electronic component to be reduced.

In the above composite electronic component, the first end face of the capacitor body and the first end face of the inductor body are preferably positioned on the same face.

With the above composite electronic component, the first end face of the capacitor body and the first end face of the inductor body are positioned on the same face. Accordingly, when the first end face of the capacitor body and the first end face of the inductor body are used as the mounting faces, the mounting faces are made flat, thus stabilizing the orientation in the mounting of the composite electronic component.

In the above composite electronic component, the multiple capacitor outer electrodes preferably include a first outer electrode provided on the first end face of the capacitor body and a second outer electrode provided on the second end face of the capacitor body. The first outer electrode and the second outer electrode are preferably electrically connected to each other with the capacitor element disposed therebetween. The multiple inductor outer electrodes preferably include a third outer electrode and a fourth outer electrode, which are provided on the first end face of the inductor body, and a fifth outer electrode provided on the second end face of the inductor body, the third outer electrode and the fifth outer electrode are preferably electrically connected to each other, and the fourth outer electrode and the fifth outer electrode are preferably electrically connected to each other with the inductor element disposed therebetween. The second outer electrode and the fifth outer electrode are preferably electrically connected to each other.

With the above composite electronic component, in a state in which the capacitor component and the inductor component are integrated with each other, the second end face of the capacitor body and the second end face of the inductor body are positioned in the same direction. Since the second outer electrode provided on the second end face of the capacitor body is electrically connected to the fifth outer electrode provided on the second end face of the inductor body, it is easy to electrically connect the capacitor component and the inductor component to each other.

In the above composite electronic component, the capacitor component and the inductor component are preferably entirely covered with resin.

With the above composite electronic component, the capacitor component and the inductor component are capable of being securely integrated with each other using the resin.

In the above composite electronic component, the second end face of the capacitor body and the second end face of the inductor body are preferably positioned on the same face.

With the above composite electronic component, the second outer electrode provided on the second end face of the capacitor body and the fifth outer electrode provided on the second end face of the inductor body are positioned on the same face to easily electrically connect the second outer electrode and the fifth outer electrode to each other.

In the above composite electronic component, the shortest distance between the first outer electrode and the third outer electrode, the shortest distance between the first outer electrode and the fourth outer electrode, and the shortest distance between the third outer electrode and the fourth outer electrode are preferably longer than or equal to about 50 μm and shorter than or equal to about 80 μm.

With the above composite electronic component, it is possible to prevent contact between the first outer electrode, the third outer electrode, and the fourth outer electrode while decreasing the areas of the first end face of the capacitor body and the first end face of the inductor body.

In the above composite electronic component, the inductor component may include a first inductor component and a second inductor component. The capacitor body may have a second side face along the longitudinal direction, which is positioned at the opposite side of the first side face. The first side face of the capacitor body may be opposed to the first side face of the inductor body in the first inductor component. The second side face of the capacitor body may be opposed to the first side face of the inductor body in the second inductor component. The first end face of the capacitor body, the first end face of the inductor body in the first inductor component, and the first end face of the inductor body in the second inductor component may be positioned in the same direction.

With the above composite electronic component, the first inductor component is capable of being positioned symmetrically with the second inductor component with the capacitor component interposed therebetween. Accordingly, when the composite electronic component is mounted on the mounting board using the first end face of the capacitor body in the capacitor component, the first end face of the inductor body in the first inductor component, and the first end face of the inductor body in the second inductor component as the mounting faces, it is possible to stabilize the orientation in the mounting of the composite electronic component.

In the above composite electronic component, the sum of the area of the first end face of the capacitor body and the area of the first end face of the inductor body is preferably smaller than at least one of the area of the first side face of the capacitor body and the area of the first side face of the inductor body.

With the above composite electronic component, it is possible to further reduce the mounting area when the composite electronic component is mounted on the mounting board using the first end faces of the capacitor body and the inductor body as the mounting faces.

In the above composite electronic component, the capacitor component may be a multilayer capacitor component.

In the above composite electronic component, the inductor component may be a multilayer inductor component or a winding inductor component.

In the above composite electronic component, the inductor body may be a magnetic body.

According to the composite electronic component of the present disclosure, it is possible to decrease the mounting area in mounting on the mounting board.

Other features, elements, characteristics and advantages of the present disclosure will become more apparent from the following detailed description of preferred embodiments of the present disclosure with reference to the attached drawings.

DETAILED DESCRIPTION

Embodiments of the present disclosure will herein be described in detail with reference to the drawings.

First Embodiment

Figure 1:
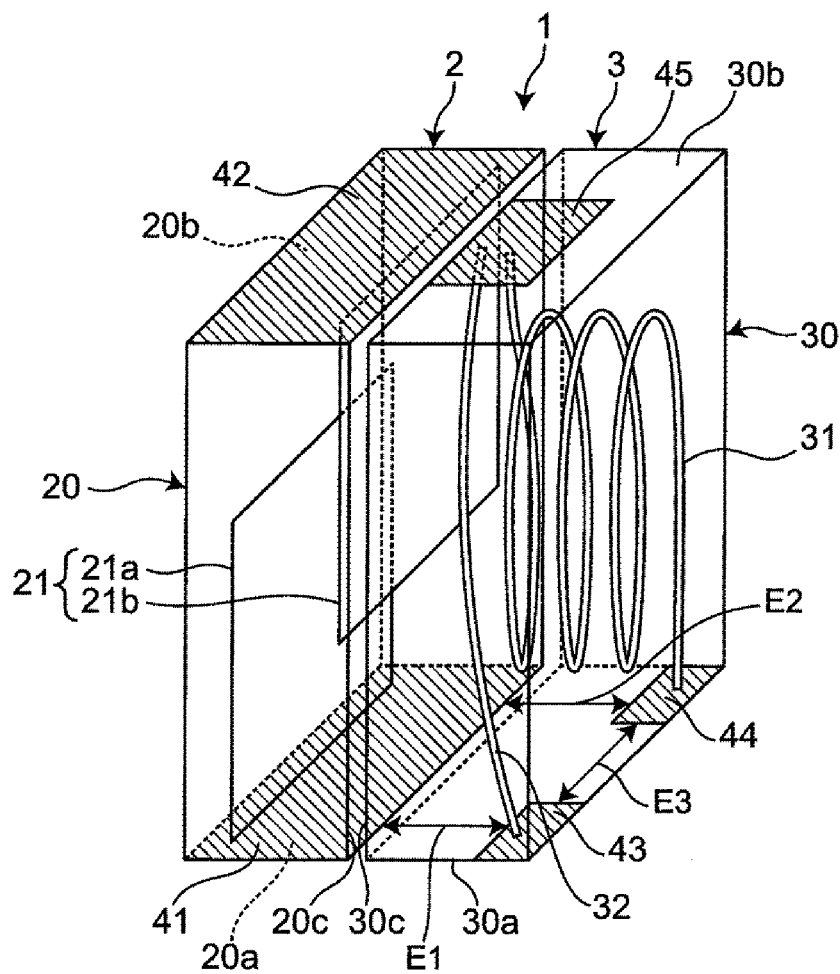
FIG. 1 is a perspective view of a composite electronic component according to a first embodiment of the present disclosure.
Figure 2:
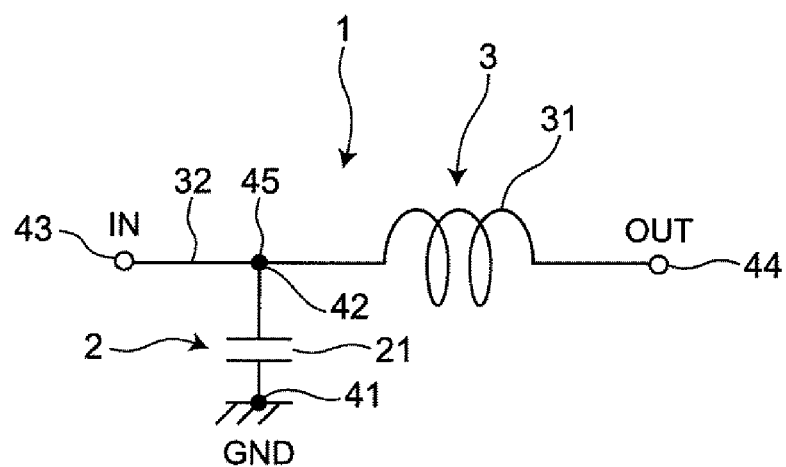
FIG. 2 is an equivalent circuit diagram of the composite electronic component according to the first embodiment.

FIG. 1 is a perspective view of a composite electronic component 1 according to a first embodiment of the present disclosure. FIG. 2 is an equivalent circuit diagram of the composite electronic component 1. Referring to FIG. 1 and FIG. 2, the composite electronic component 1 includes a capacitor component 2 and an inductor component 3. The capacitor component 2 and the inductor component 3 are electrically connected to each other to compose an LC filter.

The capacitor component 2 includes a capacitor body 20, a capacitor element 21 provided in the capacitor body 20, and a first outer electrode 41 and a second outer electrode 42 that are provided on the capacitor body 20 and that are electrically connected to the capacitor element 21. The first outer electrode 41 and the second outer electrode 42 are examples of a capacitor outer electrode. The capacitor body 20 is illustrated in a transparent manner and the first and second outer electrodes 41 and 42 are hatched in order to clarify the position of each member in FIG. 1.

The capacitor body 20 has a first end face 20a and a second end face 20b that are opposed to each other in the longitudinal direction and a first side face 20c along the longitudinal direction, with which the first end face 20a is connected to the second end face 20b. Specifically, the capacitor body 20 is a rectangular parallelepiped, the first end face 20a and the second end face 20b have a minimum area among the areas of the outer surfaces of the capacitor body 20, and the first side face 20c has a maximum area among the areas of the outer surfaces of the capacitor body 20. The longitudinal direction of the capacitor body 20 means the direction of the longest dimension, among the dimensions (length (L), width (W), and thickness (T)) in three directions of the capacitor body 20 and is normally the direction of the L dimension.

The capacitor body 20 is a dielectric body and is made of, for example, ceramics. The first outer electrode 41 is provided on the first end face 20a of the capacitor body 20.

The inductor component 3 includes an inductor body 30, an inductor element 31 provided in the inductor body 30, and a third outer electrodes 43, a fourth outer electrode 44, and a fifth outer electrode 45 that are provided on the inductor body 30 and that are electrically connected to the inductor element 31. The third to fifth outer electrodes 43 to 45 are an example of an inductor outer electrode. The inductor body 30 is illustrated in a transparent manner and the third to fifth outer electrodes 43 to 45 are hatched in order to clarify the position of each member in FIG. 1.

The inductor body 30 has a first end face 30a and a second end face 30b that are opposed to each other in the longitudinal direction and a first side face 30c along the longitudinal direction, with which first end face 30a is connected to the second end face 30b. Specifically, the inductor body 30 is a rectangular parallelepiped, the first end face 30a and the second end face 30b have a minimum area among the areas of the outer surfaces of the inductor body 30, and the first side face 30c has a maximum area among the areas of the outer surfaces of the inductor body 30. The longitudinal direction of the inductor body 30 means the direction of the longest dimension, among the dimensions (L, W, and T) in three directions of the inductor body 30.

The inductor body 30 is a magnetic body. For example, the inductor body 30 is made of ferrite or is composed of a composite body including magnetic metal and resin (or glass). The third outer electrode 43 and the fourth outer electrode 44 are provided on the first end face 30a of the inductor body 30.

The first side face 20c of the capacitor body 20 is opposed to the first side face 30c of the inductor body 30. The first end face 20a of the capacitor body 20 and the first end face 30a of the inductor body 30 are positioned in the same direction (the bottom direction in FIG. 1). The first side face 20c of the capacitor body 20 may be directly in contact with the first side face 30c of the inductor body 30 or the first side face 20c of the capacitor body 20 may be indirectly connected to the first side face 30c of the inductor body 30 via an intervening member, such as by adhesive. The capacitor body 20 and the inductor body 30 are illustrated so as to be slightly spaced from each other in order to clarify the position of each member in FIG. 1.

With the composite electronic component 1, the capacitor component 2 is capable of being integrated with the inductor component 3 so that the large first side face 20c of the capacitor body 20 is opposed to the large first side face 30c of the inductor body 30 and so that the small first end face 20a of the capacitor body 20 and the small first end face 30a of the inductor body 30 are positioned in the same direction. In mounting of the capacitor component 2 and the inductor component 3, which are integrated with each other, on a mounting board, the first end faces 20a and 30a are used as mounting faces because the first outer electrode 41 is provided on the first end face 20a of the capacitor body 20 and the third outer electrode 43 and the fourth outer electrode 44 are provided on the first end face 30a of the inductor body 30. Using the small first end face 20a of the capacitor body 20 and the small first end face 30a of the inductor body 30 as the mounting faces enables the mounting area of the composite electronic component to be reduced. Accordingly, multiple composite electronic components 1 are capable of being mounted on the mounting board at high density.

Since the first outer electrode 41 is provided on the first end face 20a of the capacitor body 20 and the third outer electrode 43 and the fourth outer electrode 44 are provided on the first end face 30a of the inductor body 30, the first outer electrode 41 of the capacitor component 2 and the third outer electrode 43 and the fourth outer electrode 44 of the inductor component 3 are capable of being used as connection electrodes for connection to the mounting board when the first end face 20a of the capacitor body 20 and the first end face 30a of the inductor body 30 are used as the mounting faces.

Since the single capacitor component 2 and the single inductor component 3 are used, desired filter characteristics are capable of being easily achieved, as in general modularization.

Even when high capacitance is required in the capacitor component 2, use of a compact high-capacitance capacitor component made of a low permittivity material enables the capacitor component to have low loss, thus improving the attenuation characteristics of the filter.

Since it is not necessary to concurrently fire the capacitor body 20 and the inductor body 30, problems, such as delamination caused by the concurrent firing of the capacitor body 20 and the inductor body 30 made of different materials, are suppressed, thus realizing the composite electronic component 1 with high reliability.

An exemplary configuration of the composite electronic component 1 will now be described.

The first outer electrode 41 is provided on the first end face 20a of the capacitor body 20, and the second outer electrode 42 is provided on the second end face 20b of the capacitor body 20. The first outer electrode 41 is provided over the first end face 20a. The second outer electrode 42 is provided over the second end face 20b.

The first outer electrode 41 and the second outer electrode 42 are electrically connected to each other via the capacitor element 21. The capacitor element 21 includes a first electrode 21a connected to the first outer electrode 41 and a second electrode 21b connected to the second outer electrode 42. The first electrode 21a and the second electrode 21b are disposed so as to be spaced from each other. The capacitor element 21 may be composed of three or more electrodes.

The capacitor component 2 is, for example, a multilayer capacitor component. Specifically, multiple dielectric layers composing the capacitor body 20 are laminated, printing paste composing the capacitor element 21 is applied on the dielectric layers, the dielectric layers having the printing paste applied thereon are fired, and the outer electrodes are applied to form the multilayer capacitor component.

The third outer electrode 43 and the fourth outer electrode 44 are provided on the first end face 30a of the inductor body 30, and the fifth outer electrode 45 is provided on the second end face 30b of the inductor body 30. The third outer electrode 43 is provided at one corner of the first end face 30a, which is apart from the first side face 30c. The fourth outer electrode 44 is provided at the other corner of the first end face 30a, which is apart from the first side face 30c. The fifth outer electrode 45 is provided in a portion of the second end face 30b, which is close to the first side face 30c.

The third outer electrode 43 and the fifth outer electrode 45 are electrically connected to each other. The fourth outer electrode 44 and the fifth outer electrode 45 are electrically connected to each other via the inductor element 31. Specifically, the third outer electrode 43 is connected to the fifth outer electrode 45 via a connection line 32. The third outer electrode 43, the connection line 32, the fifth outer electrode 45, the inductor element 31, and the fourth outer electrode 44 are sequentially connected in series to each other.

The inductor component 3 is, for example, a multilayer inductor component or a winding inductor component. When the inductor component 3 is a multiplayer inductor component, multiple magnetic layers composing the inductor body 30 are laminated, printing paste composing the inductor element 31 is applied on the magnetic layers, the magnetic layers having the printing paste applied thereon are fired, and the outer electrodes are applied to form the multilayer inductor component. When the inductor component 3 is a winding inductor component, winding wire composing the inductor element 31 is covered with the magnetic body composing the inductor body 30 to form the winding inductor component.

The second outer electrode 42 and the fifth outer electrode 45 are electrically connected to each other. Specifically, the second outer electrode 42 and the fifth outer electrode 45 are connected to each other using solder. Instead of the solder, conductive adhesive may be used to connect the second outer electrode 42 and the fifth outer electrode 45 to each other.

Accordingly, in a state in which the capacitor component 2 and the inductor component 3 are integrated with each other, the second end face 20b of the capacitor body 20 and the second end face 30b of the inductor body 30 are positioned in the same direction. Since the second outer electrode 42 provided on the second end face 20b of the capacitor body 20 is electrically connected to the fifth outer electrode 45 provided on the second end face 30b of the inductor body 30, it is easy to electrically connect the capacitor component 2 and the inductor component 3 to each other.

The connection of the second outer electrode 42 and the fifth outer electrode 45 to each other using the solder enables the capacitor component 2 and the inductor component 3 to be modularized. Accordingly, the modularization is realized without using the substrate, unlike the related art. The first side face 20c of the capacitor body 20 and the first side face 30c of the inductor body 30 may be fixed to each other using adhesive.

In the inductor component 3, the provision of the third and fourth outer electrodes 43 and 44 so as to be apart from the first outer electrode 41 and the provision of the fifth outer electrode 45 so as to be close to the second outer electrode 42 enable the inductor component 3 and the capacitor component 2 to be integrated with each other. Accordingly, a known product is capable of being used for the capacitor component 2 only by improving the outer electrodes in the known product to produce the inductor component 3.

The first end face 20a of the capacitor body 20 and the first end face 30a of the inductor body 30 are positioned on the same face. Accordingly, when the first end face 20a of the capacitor body 20 and the first end face 30a of the inductor body 30 are used as the mounting faces, the mounting faces are made flat, thus stabilizing the orientation in the mounting of the composite electronic component 1.

The second end face 20b of the capacitor body 20 and the second end face 30b of the inductor body 30 are positioned on the same face. Accordingly, the second outer electrode 42 provided on the second end face 20b of the capacitor body 20 and the fifth outer electrode 45 provided on the second end face 30b of the inductor body 30 are positioned on the same face to easily electrically connect the second outer electrode 42 and the fifth outer electrode 45 to each other.

The first end face 20a of the capacitor body 20 and the first end face 30a of the inductor body 30 are positioned on the same face and the second end face 20b of the capacitor body 20 and the second end face 30b of the inductor body 30 are positioned on the same face. In other words, the size in the longitudinal direction of the capacitor component 2 is the same as that of the inductor component 3.

It is preferred that a shortest distance E1 between the first outer electrode 41 and the third outer electrode 43, a shortest distance E2 between the first outer electrode 41 and the fourth outer electrode 44, and a shortest distance E3 between the third outer electrode 43 and the fourth outer electrode 44 be longer than or equal to about 50 µm and shorter than or equal to about 80 µm. Accordingly, it is possible to prevent contact between the first outer electrode 41, the third outer electrode 43, and the fourth outer electrode 44 while decreasing the areas of the first end face 20a of the capacitor body 20 and the first end face 30a of the inductor body 30.

It is preferred that the sum of the area of the first end face 20a of the capacitor body 20 and the area of the first end face 30a of the inductor body 30 be smaller than at least one of the area of the first side face 20c of the capacitor body 20 and the area of the first side face 30c of the inductor body 30. With this configuration, it is possible to further reduce the mounting area when the composite electronic component 1 is mounted on the mounting board using the first end face 20a of the capacitor body 20 and the first end face 30a of the inductor body 30 as the mounting faces.

As illustrated in FIG. 2, in mounting of the composite electronic component 1 on the mounting board, connection of the third outer electrode 43 of the inductor component 3 to an input terminal IN of the mounting board, connection of the fourth outer electrode 44 of the inductor component 3 to an output terminal OUT of the mounting board, and connection of the first outer electrode 41 of the capacitor component 2 to a ground terminal GND of the mounting board enable the composite electronic component 1 to be used as a substantially L-shaped LC filter.

Second Embodiment

Figure 3:
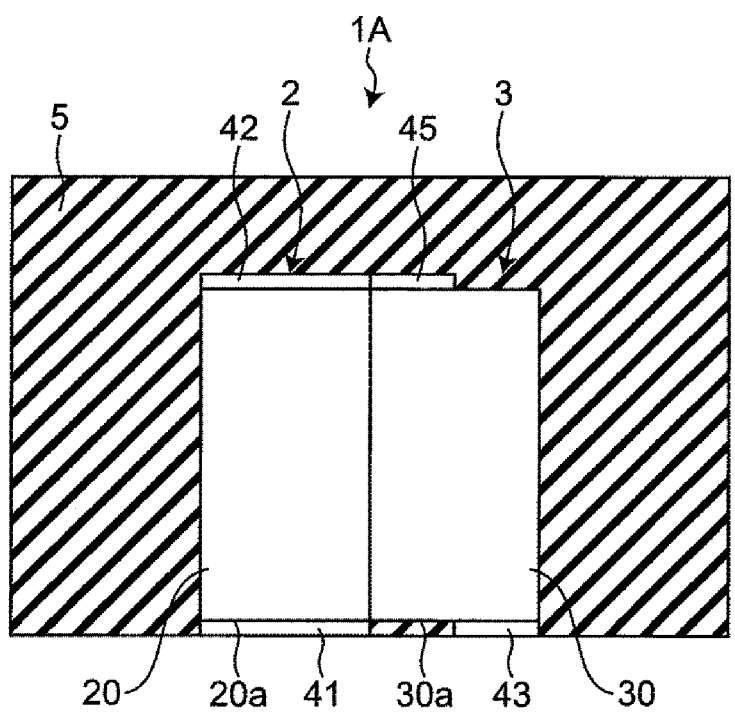
FIG. 3 is a cross-sectional view of a composite electronic component according to a second embodiment of the present disclosure.

FIG. 3 is a cross-sectional view of a composite electronic component according to a second embodiment of the present disclosure. The composite electronic component according to the second embodiment differs from the composite electronic component according to the first embodiment in that the capacitor component 2 and the inductor component 3 are covered with resin. The configuration different from that of the first embodiment will be described here. The same reference numerals are used in the second embodiment to identify the same components in the first embodiment. A description of such components is omitted herein.

Referring to FIG. 3, in a composite electronic component 1A, the capacitor component 2 and the inductor component 3 are entirely covered with resin 5. The resin 5 is, for example, epoxy resin and the capacitor component 2 and the inductor component 3 are capable of being embedded in the resin 5 through integral molding, such as molding or pressure bonding of a resin sheet.

All of the first outer electrode 41, which is provided on the first end face 20a of the capacitor body 20, and the third outer electrode 43 and the fourth outer electrode 44, which are provided on the first end face 30a of the inductor body 30, are exposed from the resin 5. Accordingly, all of the first outer electrode 41, which is provided on the first end face 20a of the capacitor body 20, and the third outer electrode 43 and the fourth outer electrode 44, which are provided on the first end face 30a of the inductor body 30, are capable of being connected to the mounting board.

With the composite electronic component 1A, it is possible to securely integrate the capacitor component 2 and the inductor component 3 with each other using the resin 5.

Third Embodiment

Figure 4:
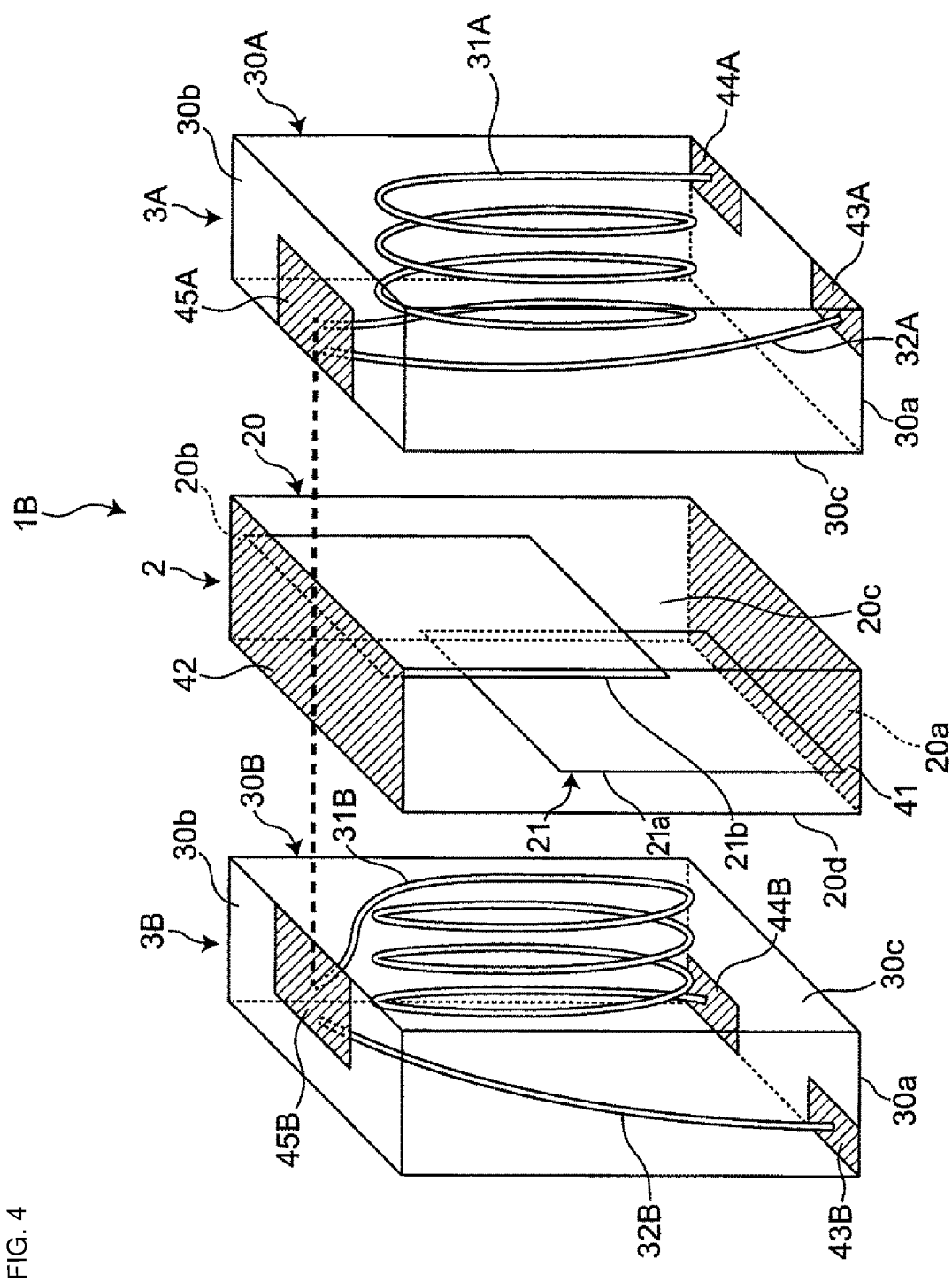
FIG. 4 is an exploded perspective view of a composite electronic component according to a third embodiment of the present disclosure.

FIG. 4 is an exploded perspective view of a composite electronic component according to a third embodiment of the present disclosure. The composite electronic component according to the third embodiment differs from the composite electronic component according to the first embodiment in that the composite electronic component according to the third embodiment includes two inductor components. The configuration different from that of the first embodiment will be described here. The same reference numerals are used in the third embodiment to identify the same components in the first embodiment. A description of such components is omitted herein.

Referring to FIG. 4, a composite electronic component 1B includes a first inductor component 3A and a second inductor component 3B. The capacitor body 20 has a second side face 20d along the longitudinal direction, which is positioned at the opposite side of the first side face 20c.

The first side face 20c of the capacitor body 20 is opposed to the first side face 30c of an inductor body 30A in the first inductor component 3A, and the second side face 20d of the capacitor body 20 is opposed to the first side face 30c of an inductor body 30B in the second inductor component 3B. The first end face 20a of the capacitor body 20, the first end face 30a of the inductor body 30A in the first inductor component 3A, and the first end face 30a of the inductor body 30B in the second inductor component 3B are positioned in the same direction.

The first inductor component 3A is the same as the inductor component 3 of the first embodiment (FIG. 1). The second inductor component 3B is mirror-symmetrical to the first inductor component 3A. The inductor bodies 30A and 30B, an inductor element 31A and an inductor element 31B, a connection line 32A and a connection line 32B, a third outer electrode 43A and a third outer electrode 43B, a fourth outer electrode 44A and a fourth outer electrode 44B, and a fifth outer electrode 45A and a fifth outer electrode 45B in the first inductor component 3A and the second inductor component 3B have the same configurations as those of the inductor body 30, the inductor element 31, the connection line 32, the third outer electrode 43, the fourth outer electrode 44, and the fifth outer electrode 45, respectively.

The second outer electrode 42 of the capacitor component 2, the fifth outer electrode 45A of the first inductor component 3A, and the fifth outer electrode 45B of the second inductor component 3B are electrically connected to each other, as illustrated by a broken line in FIG. 4.

Figure 5:
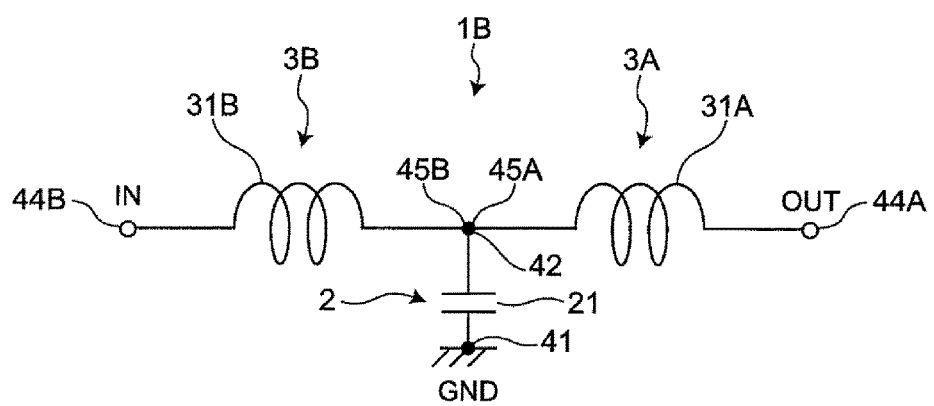
FIG. 5 is an equivalent circuit diagram of the composite electronic component according to the third embodiment.

FIG. 5 is an equivalent circuit diagram of the composite electronic component 1B. As illustrated in FIG. 5, in mounting of the composite electronic component 1B on the mounting board, connection of the fourth outer electrode 44B of the second inductor component 3B to the input terminal IN of the mounting board, connection of the fourth outer electrode 44A of the first inductor component 3A to the output terminal OUT of the mounting board, and connection of the first outer electrode of the capacitor component 2 to the ground terminal GND of the mounting board enable the composite electronic component 1B to be used as a substantially T-shaped LC filter. The third outer electrode 43A of the first inductor component 3A and the third outer electrode 43B of the second inductor component 3B are connected to no terminal of the mounting board.

With the composite electronic component 1B, the first inductor component 3A is capable of being positioned symmetrically with the second inductor component 3B with the capacitor component 2 interposed therebetween. Accordingly, when the composite electronic component 1B is mounted on the mounting board using the first end face 20a of the capacitor body 20 in the capacitor component 2, the first end face 30a of the inductor body 30A in the first inductor component 3A, and the first end face 30a of the inductor body 30B in the second inductor component 3B as the mounting faces, it is possible to stabilize the orientation in the mounting of the composite electronic component 1B.

In particular, since the first inductor component 3A is mirror-symmetrical to the second inductor component 3B, the third outer electrode 43A and the fourth outer electrode 44A of the first inductor component 3A are capable of being disposed symmetrically with the third outer electrode 43B and the fourth outer electrode 44B of the second inductor component 3B with respect to the first outer electrode 41 of the capacitor component 2, viewed from the side of the first end faces 20a, 30a, and 30a. Accordingly, in soldering of the first outer electrode 41, the third outer electrode 43A, the fourth outer electrode 44A, the third outer electrode 43B, and the fourth outer electrode 44B on the mounting board, it is possible to prevent the composite electronic component 1B from rotating to stabilize the orientation of the composite electronic component 1B.

The present disclosure is not limited to the above embodiments and may be varied in design within the spirit and scope of the disclosure. For example, the features of the first to third embodiments may be combined in various manners.

In the above embodiments, three or more outer electrodes may be provided as the capacitor outer electrodes. Two or more outer electrodes may be provided on the first end face of the capacitor body. Four or more outer electrodes may be provided as the inductor outer electrodes. Three or more outer electrodes may be provided on the first end face of the inductor body.

In the above embodiments, a step may be provided between the first end face of the capacitor body and the first end face of the inductor body. The composite electronic component is capable of being mounted on the mounting board in accordance with the shape of the mounting board.

In the above embodiments, a step may be provided between the second end face of the capacitor body and the second end face of the inductor body. The capacitor component and the inductor component, which have different sizes, may be used.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A composite electronic component comprising:
   a capacitor component including a capacitor body, a capacitor element provided in the capacitor body, and a plurality of capacitor outer electrodes that are provided on the capacitor body and that are electrically connected to the capacitor element; and
   an inductor component including an inductor body, an inductor element provided in the inductor body, and a plurality of inductor outer electrodes that are provided on the inductor body and that are electrically connected to the inductor element,
   wherein the capacitor body has a first end face and a second end face that are opposed to each other in a longitudinal direction and a first side face along the longitudinal direction, with which the first end face is connected to the second end face, and at least one of the capacitor outer electrodes is provided on the first end face of the capacitor body,
   wherein the inductor body has a first end face and a second end face that are opposed to each other in the longitudinal direction and a first side face along the longitudinal direction, with which the first end face is connected to the second end face, and at least one of the inductor outer electrodes is provided on the first end face of the inductor body,
wherein the first side face of the capacitor body is opposed to the first side face of the inductor body,
wherein the first end face of the capacitor body and the first end face of the inductor body are positioned on a same side of the composite electronic component, and
wherein a sum of an area of the first end face of the capacitor body and an area of the first end face of the inductor body is smaller than at least one of an area of the first side face of the capacitor body and an area of the first side face of the inductor body.

2. The composite electronic component according to claim 1,
wherein the first end face of the capacitor body and the first end face of the inductor body are positioned on a same plane.

3. The composite electronic component according to claim 1,
wherein the plurality of capacitor outer electrodes include a first outer electrode provided on the first end face of the capacitor body and a second outer electrode provided on the second end face of the capacitor body,
wherein the first outer electrode and the second outer electrode are electrically connected to each other with the capacitor element disposed therebetween,
wherein the plurality of inductor outer electrodes include a third outer electrode and a fourth outer electrode, which are provided on the first end face of the inductor body, and a fifth outer electrode provided on the second end face of the inductor body, the third outer electrode and the fifth outer electrode are electrically connected to each other, and the fourth outer electrode and the fifth outer electrode are electrically connected to each other with the inductor element disposed therebetween, and
wherein the second outer electrode and the fifth outer electrode are electrically connected to each other.

4. The composite electronic component according to claim 3,
wherein a shortest distance between the first outer electrode and the third outer electrode, a shortest distance between the first outer electrode and the fourth outer electrode, and a shortest distance between the third outer electrode and the fourth outer electrode are longer than or equal to about 50 µm and shorter than or equal to about 80 µm.

5. The composite electronic component according to claim 3,
wherein the second end face of the capacitor body and the second end face of the inductor body are positioned on a same plane.

6. The composite electronic component according to claim 1,
wherein the capacitor component and the inductor component are entirely covered with resin.

7. The composite electronic component according to claim 1,
wherein the inductor component includes a first inductor component and a second inductor component,
wherein the capacitor body has a second side face along the longitudinal direction, which is positioned at the opposite side of the first side face,
wherein the first side face of the capacitor body is opposed to the first side face of the inductor body in the first inductor component,
wherein the second side face of the capacitor body is opposed to the first side face of the inductor body in the second inductor component, and
wherein the first end face of the capacitor body, the first end face of the inductor body in the first inductor component, and the first end face of the inductor body in the second inductor component are positioned in a same direction.

8. The composite electronic component according to claim 1,
wherein the inductor body is a magnetic body.

9. The composite electronic component according to claim 1,
wherein the capacitor component is a multilayer capacitor component.

10. The composite electronic component according to claim 1,
wherein the inductor component is a multilayer inductor component or a winding inductor component.

* * * * *